United States Patent [19]
Cox

[11] Patent Number: 5,890,097
[45] Date of Patent: Mar. 30, 1999

[54] APPARATUS FOR WAVEFORM DISTURBANCE MONITORING FOR AN ELECTRIC POWER SYSTEM

[75] Inventor: Roger W. Cox, Oakdale, Pa.

[73] Assignee: Eaton Corporation, Cleveland, Ohio

[21] Appl. No.: 811,377

[22] Filed: Mar. 4, 1997

[51] Int. Cl.[6] .................................................. G01R 13/02
[52] U.S. Cl. ........................ 702/67; 324/76.11; 324/76.15
[58] Field of Search ................................. 702/66, 67, 70,
702/71, 75; 341/123; 324/76.11, 76.15, 500

[56] References Cited

U.S. PATENT DOCUMENTS

| | | | |
|---|---|---|---|
| 5,487,016 | 1/1996 | Elms ........................................ | 702/71 |
| 5,544,065 | 8/1996 | Engel et al. .............................. | 702/75 |
| 5,587,917 | 12/1996 | Elms ........................................ | 702/66 |
| 5,600,527 | 2/1997 | Engel et al. .............................. | 361/93 |
| 5,627,718 | 5/1997 | Engel et al. .............................. | 361/97 |
| 5,706,204 | 1/1998 | Cox et al. ................................. | 702/67 |

Primary Examiner—James P. Trammell
Assistant Examiner—Demetra R. Smith
Attorney, Agent, or Firm—Martin J. Moran

[57] ABSTRACT

A monitor/analyzer for an alternating current (AC) electrical system responds to power line disturbances by generating a trigger signal when a change in voltage with respect to time electrical parameter is greater than a programmed threshold. The monitor/analyzer includes a sensor for sensing an AC waveform in the electrical system, an analog-to-digital converter for sampling the AC waveform, and a microcomputer. Firmware of the microcomputer cooperates with the A/D converter and provides a plurality of digital samples of the AC waveform for each of some of its AC cycles. The firmware generates each of plural dV/dt parameters of the AC waveform from a corresponding adjacent pair of the digital samples within one of the waveform's AC cycles. A trigger signal is generated when one of the dV/dt parameters is greater than the programmed threshold. The digital samples of the AC waveform before and after the power line disturbance are captured and output to a display in response to the trigger signal.

13 Claims, 6 Drawing Sheets

APPARATUS FOR WAVEFORM DISTURBANCE MONITORING FOR AN ELECTRIC POWER SYSTEM

BACKGROUND OF THE INVENTION

1. Field of the Invention

This invention relates to an apparatus for monitoring electric power systems and, more particularly, to an apparatus for digitally capturing a portion of a waveform of an electric power system in response to a waveform disturbance trigger condition.

2. Background Information

State of the art monitors for alternating current (AC) power systems incorporate microcomputers for calculating various electrical parameters such as RMS currents and voltages, peak currents and voltages, power, energy, power factor and the like. One such monitor is disclosed in U.S. Pat. No. 5,587,917. In addition to monitoring the various electrical parameters of the AC system, this monitor also digitally captures portions of the waveform for harmonic analysis. This places a very high burden on the microcomputer in the monitor. Accordingly, this monitor uses a slow sampling rate for gathering the data needed for performing the monitoring functions and operates at a second, higher rate for waveform capture in response to a manual command or automatically in response to values of selected ones of the electrical parameters which exceed predetermined thresholds.

A monitor/analyzer for an AC electrical system, disclosed in commonly owned U.S. patent application Ser. No. 08/608,387, filed on Feb. 28, 1996, responds to selected events by generating trigger signals when selected monitored electrical parameters, including neutral current, exceed programmed thresholds. The trigger signals initiate simultaneous waveform capture of multiple waveforms in the AC system. Multiple trigger signals result in sequential waveform capture so that if a plurality of triggers are programmed for the same event, extended waveform data is captured for the event.

Commonly owned U.S. patent application Ser. No. 08/608,386, filed on Feb. 28, 1996, discloses a monitor for an AC electrical system which generates on-line a display presenting the values, either in magnitude or as a percent of the fundamental, of fifty harmonics of any of the currents and voltages in the system.

A circuit interrupter, disclosed in commonly owned U.S. patent application Ser. No. 08/342,208, filed on Nov. 18, 1994, provides waveform capture in addition to protection functions. The circuit interrupter microcomputer operates in a protection mode to provide the protection functions and in a waveform capture mode to record the waveform data.

It is also known to employ a rate of change of current, di/dt, in tripping a circuit breaker. See, for example, U.S. Pat. Nos. 3,673,455; and 5,224,006.

Known monitors for AC electrical systems detect disturbances in such systems by employing information obtained from plural AC cycles.

There is a need, therefore, for an improved monitor for AC electrical systems which provides an improved capability for monitoring sub-cycle disturbances in such systems.

SUMMARY OF THE INVENTION

This need and others are satisfied by the invention, which is directed to an apparatus for monitoring an electric power system. This apparatus generates a plurality of digital samples of an alternating current (AC) waveform having a plurality of AC cycles. The apparatus captures disturbances of the AC waveform as a function of changes in waveform magnitude with respect to time from a predetermined threshold and a pair of the digital samples of one of the AC cycles. In this manner, sub-cycle disturbances in the power system line or load which affect the AC waveform may be captured and output for analysis.

The apparatus includes sensing means for sensing an AC waveform in the electric power system; sampling means for sampling the AC waveform sensed by the sensing means; and digital processing means. The digital processing means includes means cooperating with the sampling means for providing a plurality of digital samples of the AC waveform for each of some of the AC cycles of the AC waveform, means for generating a value representing a change in magnitude with respect to time of the AC waveform from a pair of the digital samples of one of the AC cycles of the AC waveform, trigger means for generating at least one trigger signal, with the trigger signal being a function of the value representing a change in magnitude with respect to time of the AC waveform and a predetermined threshold, and capture means for capturing the digital samples of the AC waveform in response to the trigger signal.

The apparatus may monitor the AC waveform by comparing adjacent digital samples of the AC line voltage, the magnitudes of which are either too far apart or else are too close to zero. In this manner, excessive voltage transients or momentary voltage interruptions are captured.

As another aspect of the invention, an apparatus for monitoring an electric power system includes sensing means for sensing a waveform of the electric power system; sampling means for sampling the waveform sensed by the sensing means; and digital processing means. The digital processing means includes means cooperating with the sampling means for providing a plurality of digital samples of the waveform, means for generating a value representing a change in magnitude with respect to time of the waveform from an adjacent pair of the digital samples, trigger means for generating at least one trigger signal, with the trigger signal being a function of the value representing a change in magnitude with respect to time of the waveform and a predetermined threshold, and capture means for capturing the digital samples of the waveform in response to the trigger signal.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
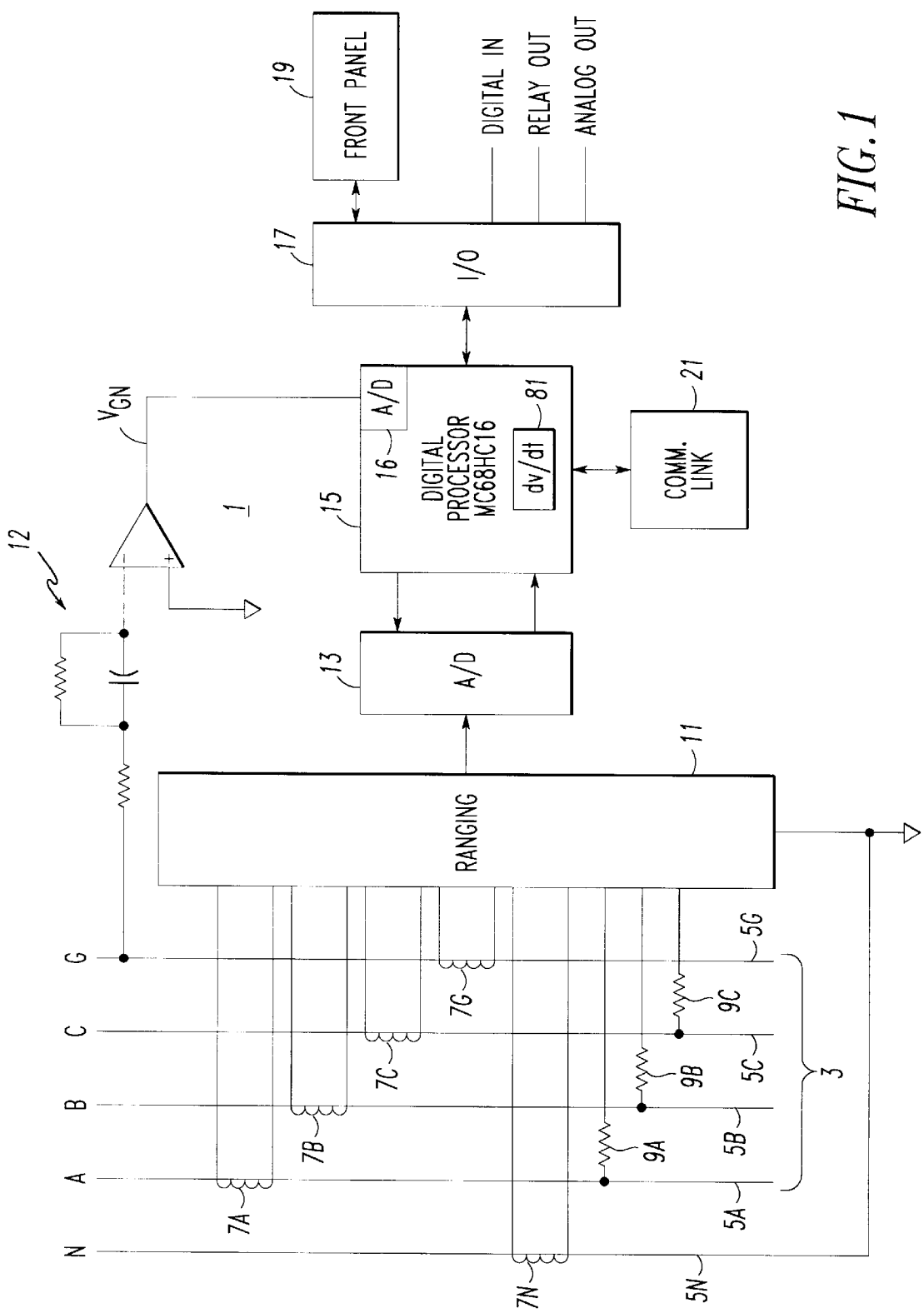
FIG. 1 is a schematic diagram primarily in block form of a monitor in accordance with the invention.

Referring to FIG. 1, the analyzer/monitor 1 of the invention is used to monitor and analyze an electric power system, such as the exemplary power distribution system 3. The power distribution system 3 has three phase conductors 5A,5B,5C, a neutral conductor 5N connected to an electrical common of the analyzer/monitor 1, and a ground conductor 5G. Current transformers 7A,7B,7C,7N,7G sense current flowing in these respective conductors while three phase-to-neutral voltages are sensed by sensing resistors 9A,9B, 9C. A ranging circuit 11 converts the sensed currents and sensed phase voltages to the appropriate range for conversion by a ±10V analog-to-digital (A/D) converter 13 for input to a digital processor 15, such as, for example, a microcomputer or microprocessor. The A/D converter 13 samples the analog signals, which correspond to the sensed currents and sensed phase voltages, at intervals determined by interrupts generated by the digital processor 15. The current transformers 7A,7B,7C,7N,7G and sensing resistors 9A,9B,9C sense waveforms (e.g., alternating current (AC) waveforms having plural AC cycles) in the power distribution system 3, which may have one of various line-to-line AC power voltages (e.g., 120 $V_{ll}$, 208 $V_{ll}$, 480 $V_{ll}$, 600 $V_{ll}$). For example, the line-to-neutral voltages of the waveforms on the phase conductors 5A,5B,5C are sensed by the respective sensing resistors 9A,9B,9C.

In the exemplary embodiment, the digital processor interrupts are generated selectively at a first, slow speed sampling rate, or a second, high speed sampling rate. Regardless of the sampling rate, on each interrupt, the A/D converter 13 samples and digitizes all five sensed currents and all three sensed phase voltages. The resulting digital samples of the waveforms, generated by the exemplary A/D converter 13, are input to the digital processor 15, although the invention is applicable to one or more A/D converters which form part of a digital processor, such as a microcomputer. The ground to neutral voltage between conductors 5G and 5N is amplified by an input circuit 12 which outputs a ground to neutral voltage signal, $V_{GN}$, to A/D converter 16 in the digital processor 15. The A/D converter 16 converts this analog signal to corresponding digital samples.

The digital processor 15 utilizes the digital samples of the A/D converters 13,16 to generate values of two sets of electrical parameters. The first set of parameters is related to the monitoring function and includes metered parameters such as: RMS currents and voltages, peak currents and voltages, minimum currents and voltages, power factor, watts, Vars, volt-amps, total harmonic distortion K-factor, CBEMA derating factor, change in voltages with respect to time (e.g., dV/dt values) and the like. The second set of parameters calculated by the digital processor 15 comprises individual harmonic coefficients. Data collection and processing, excluding the calculation of the exemplary Dv/dt values, are organized in the manner described in U.S. Pat. No 5,587,917, which is incorporated herein by reference, so that a maximum number of parameters can be monitored continuously while also providing the capability for simultaneous calculation of harmonic content.

The digital processor 15 has an input/output (I/O) circuit 17 through which such processor is connected to a front panel 19. The front panel 19 serves as an interface with a user. The user can control the operation of the analyzer/monitor 1 through the front panel 19 and monitor the AC electrical power system 3. The I/O circuit 17 also interfaces the digital processor 15 with contact inputs through digital inputs and with an external device (not shown) through relay outputs and analog outputs. The digital processor 15 can also communicate with a remote processor (not shown) through a communications link 21. Through this communications link 21, the analyzer/monitor 1 can provide information to and/or be controlled by the remote processor.

The digital processor 15 generates its interrupts to provide a slow rate for monitoring and a faster rate for data capture in order to control the burden on such processor so that all of the required functions can be performed. The exemplary sampling scheme used by the digital processor 15, excluding the calculation of Dv/dt values, is the same as that described in U.S. Pat. No. 5,587,917, referenced above, although the present invention is applicable to a wide variety of techniques for sampling a waveform and generating a value representing a change in magnitude with respect to time of the waveform from a pair of the digital samples of one of the AC cycles of an AC waveform, (e.g., periodic sampling of digital samples, periodic or aperiodic sampling of digital samples along with corresponding time values).

As is known, waveform capture requires synchronous sampling at a rate that is at least twice that of the highest harmonic to be extracted. The monitoring functions, on the other hand, do not require synchronous sampling. Hence, the technique known as equivalent sampling is used for the slow speed sampling in order to increase the effective sampling rate. In the equivalent sampling technique, the AC waveforms are sampled a selected number of times per cycle with a delay of a fraction of a cycle before another cycle of samples is taken at the same sampling rate. Thus, the sampling instants are "bumped" each cycle by the selected fraction of a cycle. The data collected over a number of such "bumped" cycles are then used to calculate various parameters.

Equivalent sampling at slow speed with selectable high speed sampling for waveform capture is implemented by sampling in frames. Each sampling frame comprises a number of repetitions of sampling for a selected number of cycles followed by a delay which is a fraction of a cycle. In the exemplary system, the selected number of cycles is two and the frame constitutes four repetitions of sampling of two cycles each followed by a delay δ. Thus, the exemplary frame is equal to eight cycles plus 4δ. The slow speed sampling rate is 32 samples per cycle and δ is made equal to ¹⁄₁₂₈ of a cycle so that the sampling frame is equal to 8 cycles plus ¹⁄₃₂ cycle of the fundamental frequency of the waveforms. This provides an equivalent sampling rate of 128 samples per cycle.

In the exemplary system, high speed sampling may be implemented in any one of the repetitions, although the invention is applicable to high speed sampling implemented in any two consecutive cycles of the sampling frame. In the exemplary system, high speed sampling, when called for, may, for example, be implemented in the fourth repetition within the frame (i.e., the seventh and eighth cycles). Any one of the repetitions can be used for high speed sampling, but it is always the same repetition within the frame. Since high speed sampling is performed for only one repetition, the sampling can be synchronous, a requirement for Fourier analysis of the harmonic content of the waveforms. By synchronous, it is meant that an integer number of samples are taken per cycle. As the delay, δ, comes at the end of the repetition, it does not disturb the synchronous sampling performed during only one repetition. The high speed sampling is carried out at a rate that is an integer multiple of the slow speed rate. In the exemplary embodiment, the high speed rate is 128 samples per cycle, which is four times the slow speed rate. This permits the slow speed data to be extracted from the high speed data, so that continuous data is available for the calculations performed during the slow speed sampling.

While the selected number of cycles in each repetition is two in the example, other numbers of cycles can be used.

However, the number of cycles selected for each repetition sets the maximum number of cycles of high speed data that can be collected during a frame.

Sampling at the high speed rate for waveform capture can be implemented automatically in response to conditions in the AC electrical power distribution system 3, such as, for instance, an overcurrent condition, a trip, a low voltage condition, or the like. In addition, high speed sampling can be commanded through the front panel 19 or remotely through the communications link 21. Also, high speed sampling can be initiated by a timer (not shown).

Figure 2:
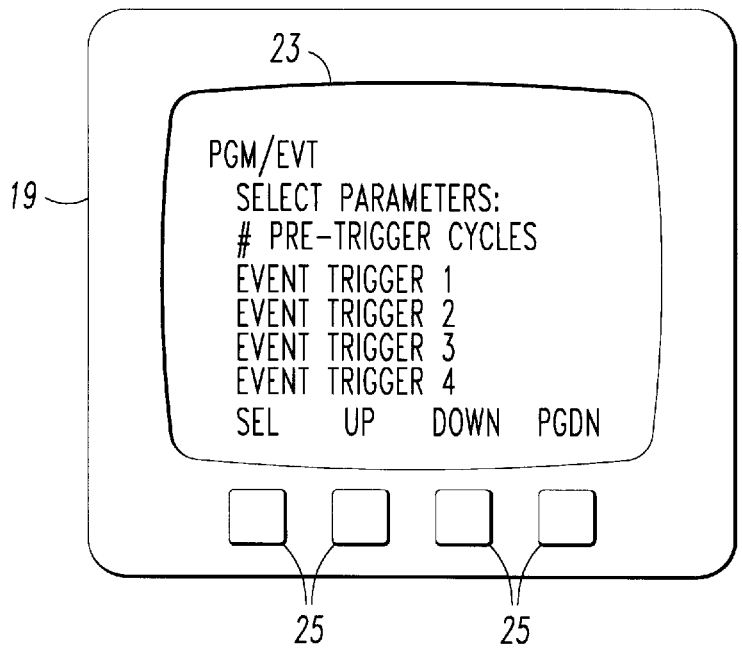
FIG. 2 is an elevation view of a display on a front panel which forms part of the monitor of FIG. 1.

Automatic high speed sampling is implemented by triggers, which are programmable. In the exemplary analyzer/monitor 1, there are seven programmable triggers. As shown in FIG. 2, the triggers are programmable through the front panel 19 which includes an exemplary display 23 and four push buttons 25, which function as soft switches in conjunction with associated switch functions that appear on the display 23. As shown, the left button 25 is a select button as indicated by the symbol SEL in the lower left hand corner of the display. Similarly, the second, third and fourth buttons 25 perform UP, DOWN and PGDN (page down) functions, respectively. The display 23 presents a series of menus. The UP and DOWN buttons permit the user to highlight an item on the menu and then select that item by pushing the SEL push button. The PGDN push button brings up additional pages of the menu (e.g., displaying a waveform). After fully paging down, this soft-key becomes a PGUP push button. Similarly, at the bottom of a menu, this soft-key becomes a TOP push button.

Figure 3A:
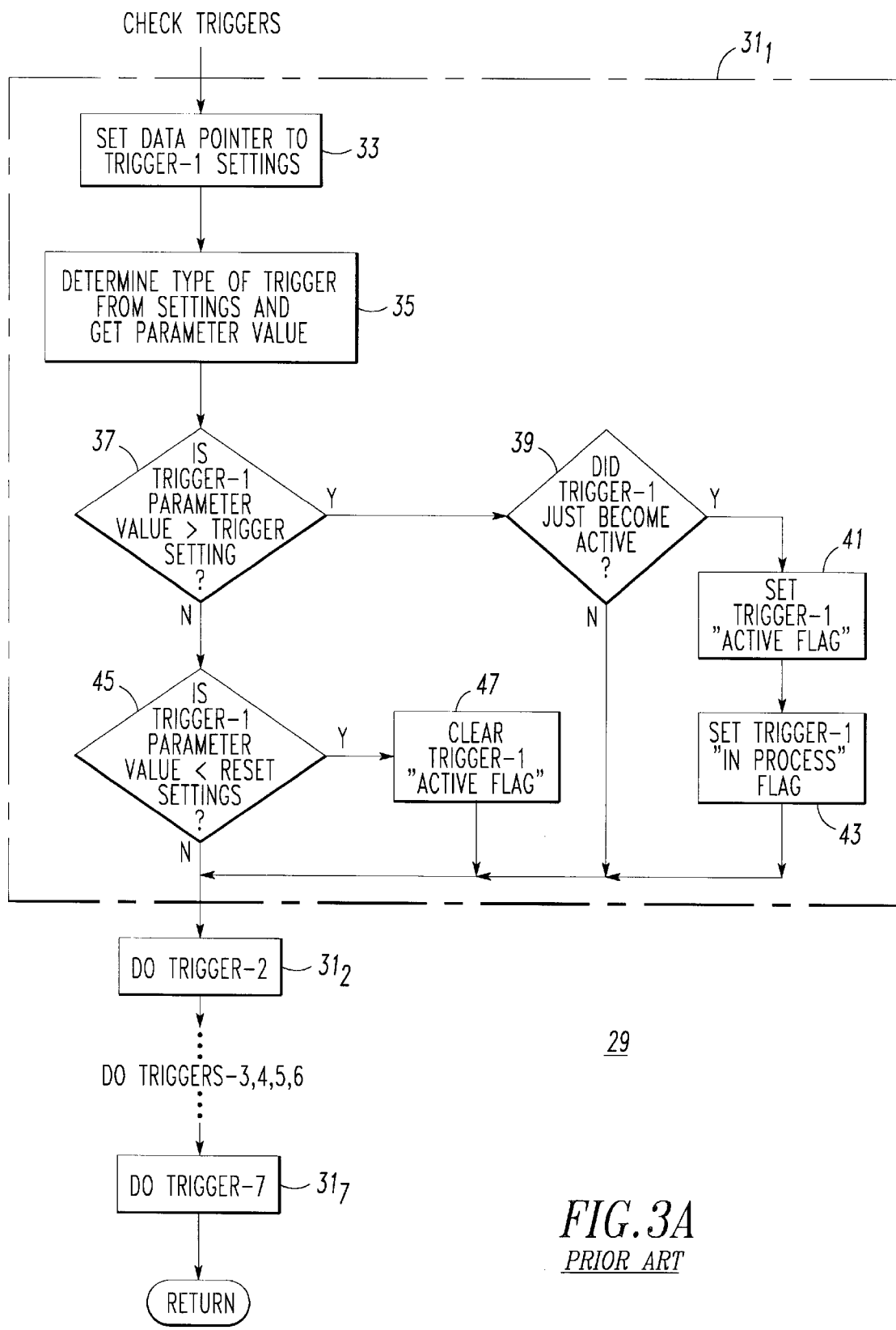
FIGS. 3A–3E are flow charts of software routines implemented by a digital processor which forms part of the monitor of FIG. 1.

The digital processor 15 runs routines that generate the interrupts for the digital sampling implemented by the A/D converter 13. In between sampling, the digital processor 15 runs other routines (e.g., those that calculate the various electrical parameters, perform input/output functions). One of these additional routines is the check triggers routine 29, which is shown in FIG. 3A. When called, the check triggers routine 29 checks each of the seven triggers in sequence. As shown, trigger-1 is checked at $31_1$ by first setting the data pointer to the trigger-1 settings at 33. The type of trigger is then determined and the associated parameter value is obtained at 35. If the trigger-1 parameter value exceeds the trigger setting as determined at 37 and this is the first implementation of the routine in which this occurs as determined at 39, then a trigger-1 ACTIVE FLAG and a trigger-1 IN PROCESS FLAG are set at 41 and 43, respectively. If the trigger-1 parameter does not exceed the trigger setting and in fact is below the reset setting as determined at 45, then the active flag for trigger-1 is cleared at 47. Similar functions are performed for trigger-2 through trigger-7 at $31_2$ through $31_7$, respectively.

Figure 3B:
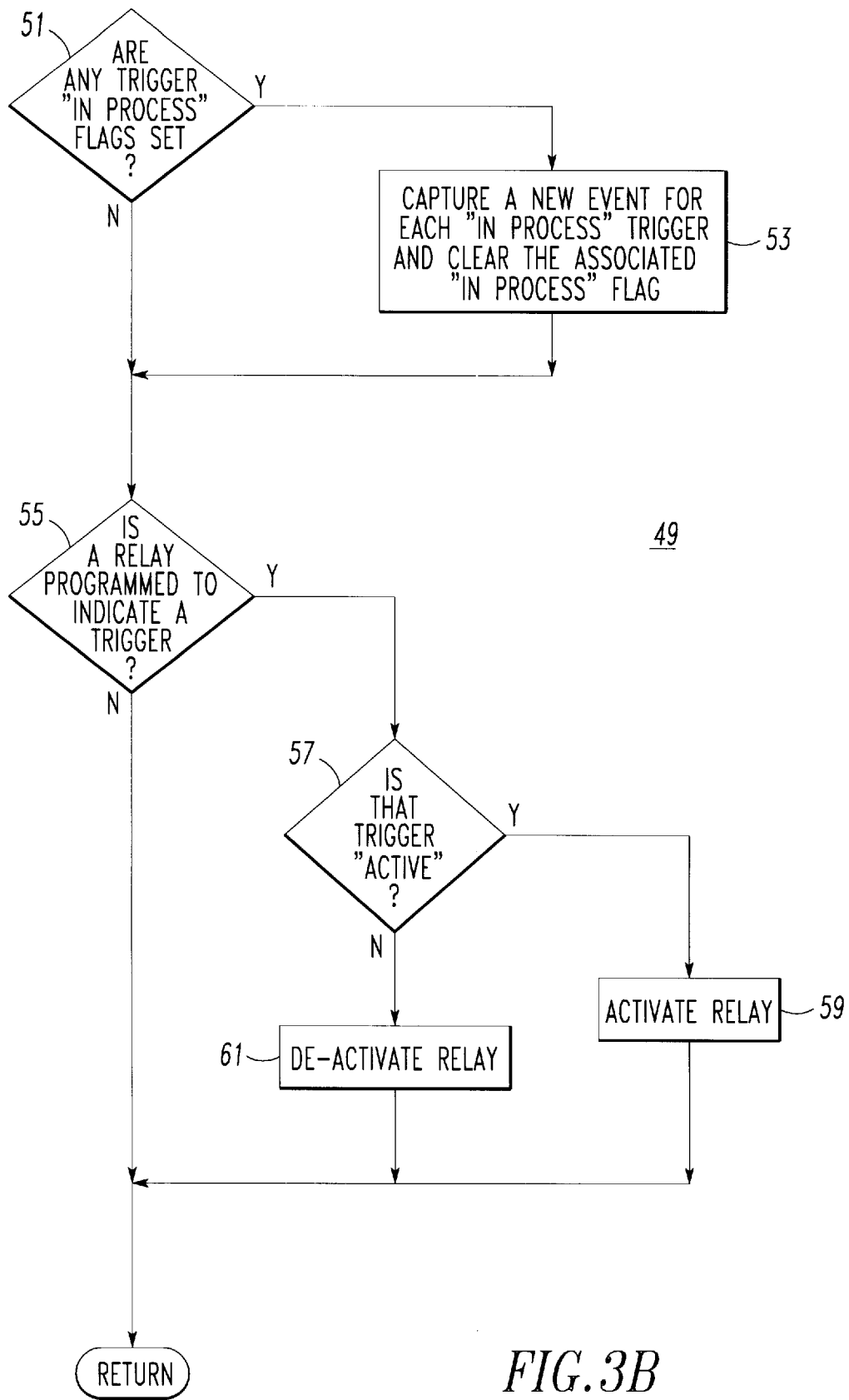

The digital processor 15 also periodically runs an events/relay routine 49 as shown in FIG. 3B. At 51, the routine 49 checks to see if any trigger IN PROCESS flags (e.g., a push button, a software flag) are set. If so, high speed sampling is initiated at 53 to capture an event. In the exemplary system, three repetitions (six AC cycles) of digital samples of the waveforms are accumulated before the trigger signal and one repetition (two AC cycles) of digital samples is accumulated after the trigger signal. Capturing an event comprises sampling at the high speed and storing the recorded samples. As mentioned, in the exemplary system, this is implemented in the fourth repetition of the two cycle sequence in a sampling frame. Capture is performed sequentially in successive frames if more than one trigger is IN PROCESS. Thus, if all of the triggers are IN PROCESS, the selected portion of each of the waveforms is captured in seven successive sampling frames. Also, the same event can be programmed into multiple triggers. Thus, for instance, if a particular event is of interest, it can be programmed into all seven triggers, and high speed samples in seven successive sampling frames will be recorded. As each trigger initiates high speed sampling, a FAST_DATA flag is set and the associated IN PROCESS flag is cleared at 53. If a relay is programmed to indicate a trigger at 55, and that trigger is active at 57, the relay is activated at 59. When the trigger is no longer active at 57, the relay is deactivated at 61.

Figure 3C:
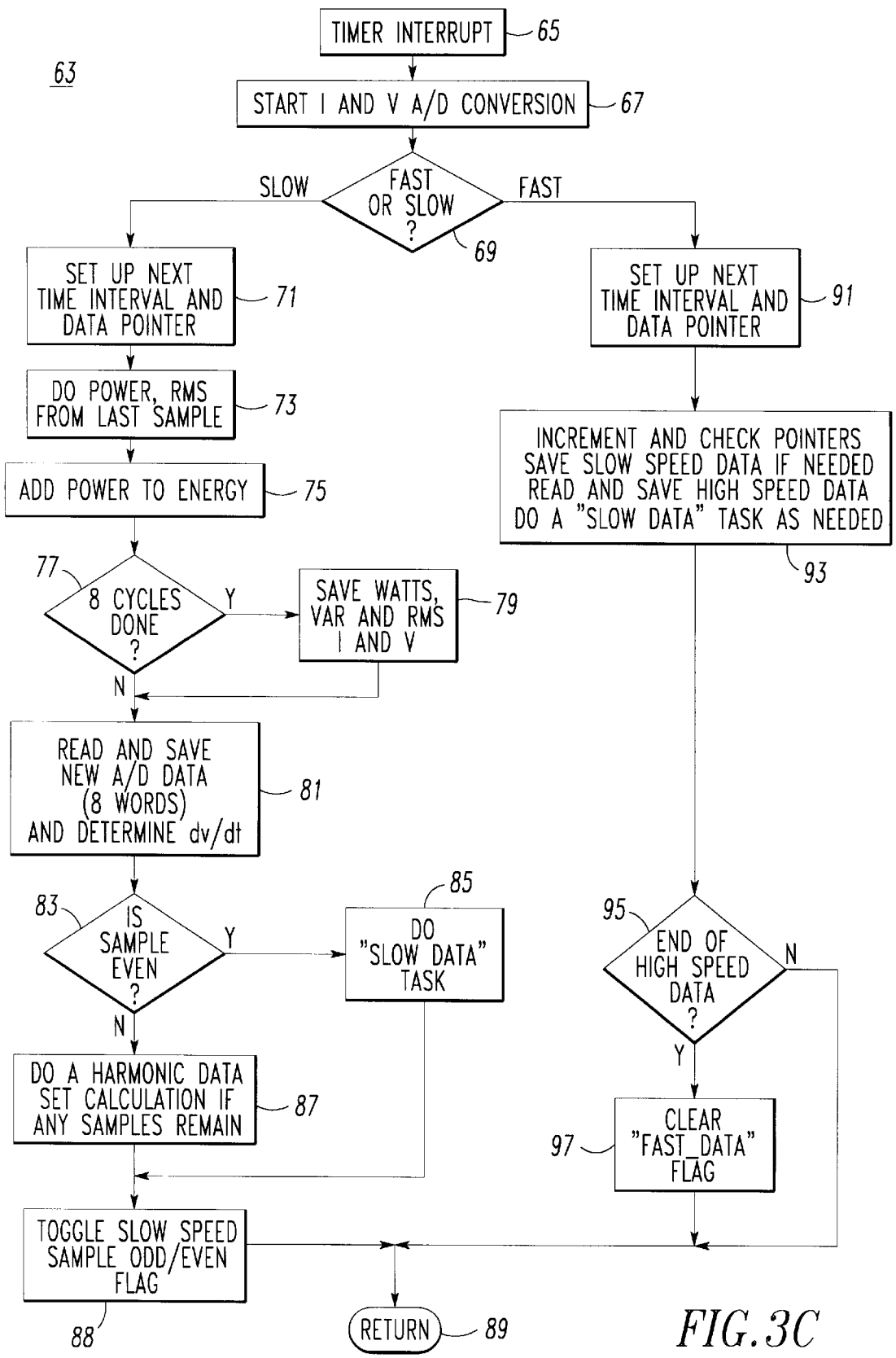

FIG. 3C is a flow chart for a timer interrupt routine 63 implemented by the digital processor 15. A significant purpose of the routine 63 is to detect the onset of a disturbance, such as a voltage transient or spike, in the AC waveform of the power distribution system 3 and, then, to capture digital samples of the waveform before and after the disturbance. The time of the onset of the disturbance is not known beforehand and, hence, it is important to detect and respond to the disturbance quickly to capture relevant information thereof in a timely manner. Digital samples before the disturbance are sampled at a first or slow rate, while digital samples after the disturbance are sampled at a second rate, faster than the first rate. The digital samples are collected in a moving frame to provide a set of potential samples before the disturbance. After the onset of the disturbance is detected by comparing the magnitude of adjacent digital samples, the routine 63 quickly responds by collecting subsequent digital samples at the second fast rate.

Each time the routine 63 is called at 65, analog to digital conversion of the sensed currents and voltages is initiated at 67. If sampling is being performed at the slow rate as determined at 69 based on a FAST_DATA flag, the time interval for the next slow interrupt is set and the pointers for storing the slow speed data are set at 71. The currents and voltages from the previous sample are then squared and the power calculation from the previous sample is performed at 73. The power calculation is then added to an energy summation at 75. When eight cycles have been completed as determined at 77, the processed values for this frame are saved at 79. Then, the digitized currents and voltages generated by the A/D converter 13 on this interrupt are saved by routine 81 (as discussed below in connection with FIG. 3D). These are the values that will be used at 73 on the next slow interrupt to calculate the power and rms values. If this is an even sample (interrupt) as determined at 83, then an appropriate "slow data" task is performed at 85.

In order to perform Fourier analysis, one-half of the computation time available in the digital processor 15 is assigned to perform that function. These computations, which generate values for the individual harmonics as a percentage of the fundamental for the analyzed waveforms, are only performed during the slow speed sampling. Thus, alternate interrupts, for instance the odd interrupts, initiate analog to digital conversion, and also trigger the computations for the Fourier analysis. The remaining tasks are assigned to the even interrupts, which also initiate analog to digital conversions. As the slow sampling rate is 32 samples per cycle, there are 16 even interrupts per cycle to which tasks can be assigned. While there are eight cycles in a frame, only six of those cycles are guaranteed as being available to perform tasks since the other two cycles must be available for high speed sampling. Therefore, there are 16×6=96 task slots always available during a frame. There are 16×2=32 additional task slots that will be available if there is no high speed sampling during the frame. Tasks of lesser importance, or requiring less frequency of updating, are assigned to these latter, conditional task slots.

As another example, where high speed sampling is implemented in the third repetition (i.e., the fifth and sixth cycles) during a frame, it is the task slots assigned to the fourth repetition which are eliminated during a high speed sampling frame. Thus, the tasks assigned to even interrupts are delayed by high speed sampling, and those which normally would have been performed during the third repetition are instead performed during the fourth repetition. The tasks performed include calculation of total harmonic distortion (THD). These calculations are performed on the even interrupts, as they are simple calculations, which only require data generated by low speed sampling, the tasks performed during any given frame utilize data collected from the previous frame.

If, on the other hand, this is an odd interrupt, a harmonic data set calculation is performed at 87. At 88, after either 85 or 87, a slow speed sample odd/even flag is toggled (for testing at 83) after which the routine 63 is then exited at 89.

During high speed sampling, as determined at 69, the time for the next high speed interrupt and the data pointers for storing high speed data are set at 91. The pointers are incremented and checked at 93 and on every fourth high speed interrupt the slow speed data is saved. On each high speed interrupt, the high speed data is saved and initial "slow data" processing, such as squaring the currents or the voltages, or performing harmonic calculations, is performed in a similar manner as at 85. If two cycles of high speed data have been collected as determined at 95, the FAST_DATA flag is reset at 97 so that the next time the timer interrupt routine 63 is called, slow speed sampling will be resumed.

The timer interrupt routine, during slow speed sampling, provides 32 digital samples for each of the sampled AC cycles of the waveforms. For example, in the exemplary embodiment for a 60 Hz power distribution system, the exemplary slow speed timer interrupt occurs 60×32=1920 times per second, in order to provide the digital samples with a periodic time interval between an adjacent pair of the digital samples. Preferably, in order to accommodate an exemplary set of two different line-to-line AC power voltages (e.g., 120 $V_{ll}$ and 480–600 $V_{ll}$), the slow speed timer interrupt is set to provide at least about 32 digital samples per AC cycle, although different counts of samples per AC cycle are possible. During high speed sampling, the timer interrupt routine provides 128 digital samples for each of the sampled AC cycles of the waveforms.

Figure 3D:
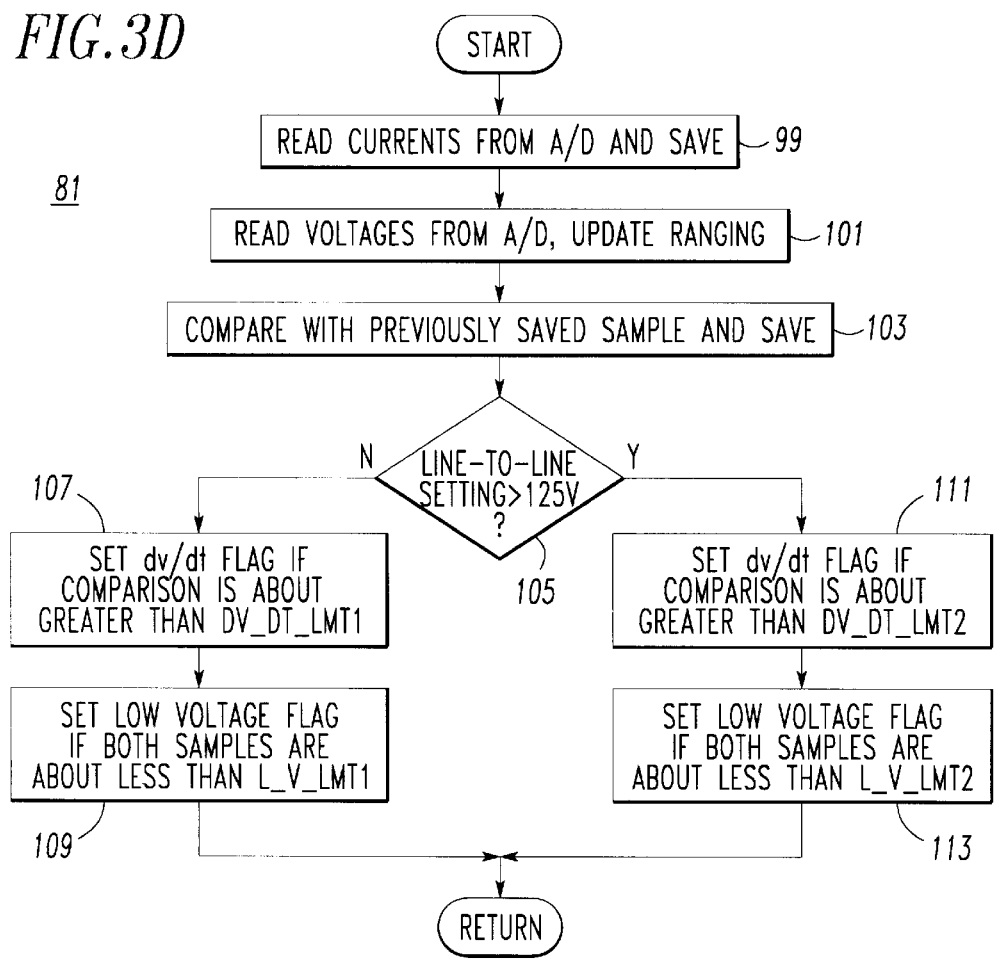

FIG. 3D is a flow chart for the routine 81 of FIG. 3C which reads and saves the digitized currents and voltages generated by the A/D converter 13 and generates a value representing a change in magnitude with respect to time of the AC waveform from a pair of the digital samples of one of the AC cycles. At 99, the digitized currents are read and saved and, then, at 101, the digitized voltages are read and saved. If the digitized voltages are too large, then the ranging circuit 11 of FIG. 1 is suitably adjusted. At 103, the newly read voltages are compared with the previously saved voltages to generate a comparison value which is saved. This comparison value, which in the exemplary embodiment is a dV/dt value, represents a change in magnitude with respect to time of one of the waveforms as determined from an adjacent pair of the corresponding digital samples. Preferably, the timer interrupt routine 63 of FIG. 3C is periodically executed (i.e., to provide a constant slow or fast dt value) and a difference between the adjacent pair of digital samples is determined at 103 (i.e., to provide a dV value).

A predetermined line-to-line voltage setting is programmed into the memory (not shown) of the digital processor 15 through the front panel 19 of FIG. 1. If this setting (e.g., 120 $V_{ll}$) is not greater than 125 VAC at 105 then, at 107, if the comparison value saved at 103 is greater than a predetermined value, DV_DT_LMT1, a dV/dt flag is set and a hold-off timer (discussed below in connection with FIG. 3E) is started. Also, at 109, if the sample saved at 103 and the sample saved in the previous execution of the routine 81 are both less than a predetermined value, L_V_LMT1, then a low voltage flag is set.

On the other hand, if the predetermined line-to-line voltage setting (e. g., 480–600 $V_{ll}$) is greater than 125 VAC at 105 then, at 111, if the comparison value saved at 103 is greater than a predetermined value, DV_DT_LMT2, the dV/dt flag is set and the hold-off timer is started. Also, at 113, if the sample saved at 103 and the sample saved in the previous execution of the routine 81 are both less than a predetermined value, L_V_LMT2, then the low voltage flag is set. After either 109 or 113, the routine 81 returns. In the exemplary embodiment, the predetermined values are set as shown below in Table I.

TABLE I

| PREDETERMINED VALUE | VALUE ($v_n$) |
|---|---|
| DV_DT_LMT1 | 75 |
| L_V_LMT1 | 4.5 |
| DV_DT_LMT2 | 200 |
| L_V_LMT2 | 8.0 |

Although two exemplary line-to-line predetermined voltage settings are discussed, it will be appreciated that the invention is applicable to one, three or more of such settings, and/or that reconfigurable voltage settings or ranges may be employed.

Figure 3E:
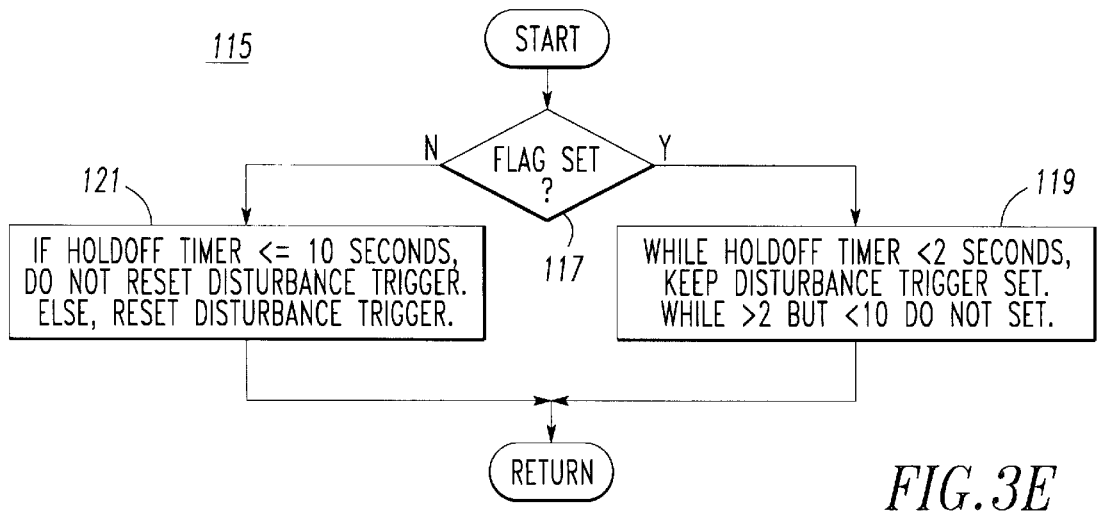

FIG. 3E is a flow chart of a routine 115 for setting and clearing trigger flags for either an excess dV/dt trigger (corresponding to 107 or 111 of FIG. 3D) or an low voltage trigger (corresponding to 109 or 113 of FIG. 3D). The exemplary routine 115, which prevents the excess dV/dt or low voltage triggers from occurring more than once to avoid a continuous stream of triggered events, is called every two line cycles by a slow data task of routine 63, although the invention is applicable to routines which are called at faster or slower rates. At 117, if the appropriate flag (i.e., the dV/dt flag of 107 or 111, or the low voltage flag of 109 or 113 of FIG. 3D) is set, then, at 119, while the hold-off timer is less than an exemplary two seconds, a corresponding (i.e., dV/dt or low voltage) disturbance trigger "IN PROCESS" flag is set. On the other hand, if the hold-off timer is greater than two but less than an exemplary ten seconds, the corresponding disturbance trigger "IN PROCESS" flag is not set and, instead, is permitted to retain its last set or reset state. Otherwise, at 117, if the appropriate flag is not set, then, at 121, while the hold-off timer is less than or equal to ten seconds, the corresponding disturbance trigger "IN PROCESS" flag is not reset and, instead, is permitted to retain its last set or reset state. On the other hand, if the hold-off timer is greater than ten seconds, the corresponding disturbance trigger "IN PROCESS" flag is reset at 121.

The dV/dt or low voltage disturbance trigger "IN PROCESS" flags are employed at 51 as discussed above in connection with FIG. 3B. In the exemplary embodiment, excess dV/dt triggers and low voltage triggers are generated for a disturbance on any of the phase conductors 5A,5B, 5C of FIG. 1. Although predetermined two and ten second time periods are employed, any suitable predetermined and/or reconfigurable time periods may be used.

Figure 4:
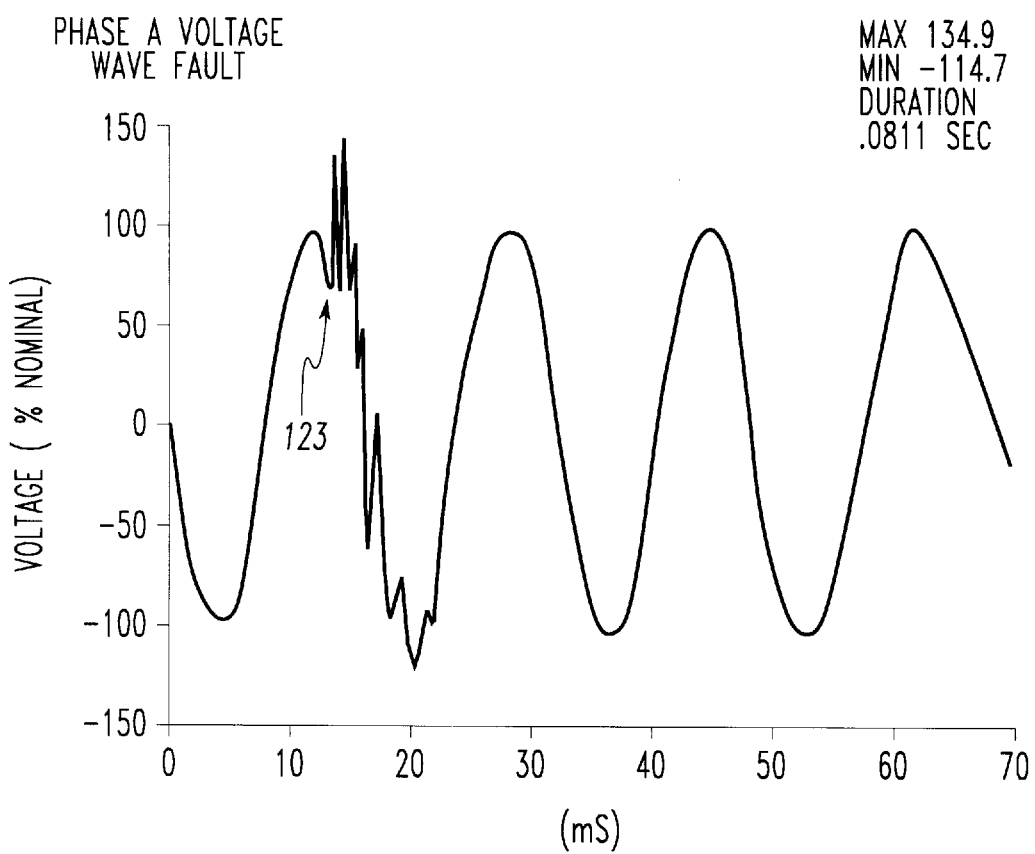
FIG. 4 is a plot of a waveform which is monitored and output by the monitor of FIG. 1.

FIG. 4 is a plot of a waveform which is digitized, monitored and output by the analyzer/monitor 1 FIG. 1. The digital processor 15 outputs the digital samples before and after the exemplary dV/dt event 123 on the front panel display 23 of FIG. 2.

The exemplary excess dV/dt and low voltage triggers monitor an AC waveform for consecutive digital samples, within an AC cycle, the magnitudes of which are too far apart or too close to zero, respectively. In this manner, excessive voltage transients are captured in addition to momentary voltage interruptions. It will be appreciated that such transients or interruptions may be induced by line or load side power circuit disruptions (e.g., power source problems, switching of power factor correcting capacitors, the sudden removal of a load, poor circuit connections) or by external events (e.g., lightning). By triggering on dV/dt (or voltage interruption), events may be captured and time-stamped that otherwise would be missed. In this manner, unusual occurrences in the system employing the power circuit may be correlated to the power circuit disruption.

Although the exemplary dV/dt flag or trigger signal is set when it is greater than the appropriate predetermined threshold, it will be appreciated that other equivalent trigger signals may be compared to be greater than or equal to a predetermined threshold or that negative logic may be employed. Similarly, although the exemplary low voltage flag or trigger signal is set when an adjacent pair of digital samples are both less than the appropriate predetermined threshold, it will be appreciated that such pair of digital samples may be less than or equal to a predetermined threshold or that negative logic may be employed.

While for clarity of disclosure reference has been made herein to the exemplary display 23 for outputting or displaying digital samples, it will be appreciated that such samples may be output in analog form, stored, printed on hard copy, computer modified, or combined with other data. All such processing shall be deemed to fall within the terms "output", "outputting", "display" or "displaying" as employed herein.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention, which is to be given the full breadth of the claims appended and any and all equivalents thereof.

What is claimed is:

1. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles, trigger means for generating at least one trigger signal, with said trigger signal being a function of said value representing a change in magnitude with respect to time of said AC waveform and a predetermined threshold;

capture means for capturing said digital samples of said AC waveform in response to said trigger signal; and wherein said sensing means includes means for sensing a voltage of said AC waveform; and wherein said means for generating a value includes means for generating a dV/dt value as said value representing a change in magnitude with respect to time of said AC waveform.

2. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles;

trigger means for generating at least one trigger signal, with said trigger signal being a function of said value representing a change in magnitude with respect to time of said AC waveform and a predetermined threshold;

capture means for capturing said digital samples of said AC waveform in response to said trigger signal; and wherein said means cooperating with said sampling means includes means for providing said digital samples with a periodic time interval between an adjacent pair of said digital samples; and wherein said means for generating a value includes means for comparing the adjacent pair of said digital samples to determine said value representing a change in magnitude with respect to time of said AC waveform.

3. The apparatus of claim 2 wherein said means for comparing includes means for determining a difference between the adjacent pair of said digital samples as said value representing a change in magnitude with respect to time of said AC waveform; and wherein said trigger means includes means for generating the trigger signal when said difference is about greater than the predetermined threshold.

4. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles;

trigger means for generating at least one trigger signal, with said trigger signal being a function of said value representing a change in magnitude with respect to time of said AC waveform and a predetermined threshold;

capture means for capturing said digital samples of said AC waveform in response to said trigger signal;

wherein said digital processing means includes means for selecting one of a plurality of predetermined thresholds as said predetermined threshold; and wherein said electric power system includes at least two voltages; and wherein said trigger means includes a first predetermined threshold for a first voltage and a second predetermined threshold for a second voltage.

5. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles, trigger means for generating at least one trigger signal, with said trigger signal being a function of said value representing a change in magnitude with respect to time of said AC waveform and a predetermined threshold;

capture means for capturing said digital samples of said AC waveform in response to said trigger signal; and wherein said predetermined threshold is a first predetermined threshold; and wherein said trigger means includes means for generating a first trigger signal when said value representing a change in magnitude with respect to time of said AC waveform is about greater than the first predetermined threshold, and means for generating a second trigger signal when both of the pair of said digital samples are about less than a second predetermined threshold.

6. The apparatus of claim 5 wherein said digital processing means includes means for selecting one of a plurality of predetermined thresholds as the second predetermined threshold.

7. The apparatus of claim 6 wherein said electric power system includes at least two voltages; and wherein said trigger means includes a first one of the predetermined thresholds for a first voltage and a second one of the predetermined thresholds for a second voltage.

8. The apparatus of claim 5 wherein said means for generating a second trigger signal generates the second trigger signal when both of the pair of said digital samples are less than the second predetermined threshold.

9. The apparatus of claim 5 wherein said means for generating a second trigger signal generates the second trigger signal when both of the pair of said digital samples are less than or equal to the second predetermined threshold.

10. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles, trigger means for generating at least one trigger signal, with said trigger signal being a function of said value representing a change in magnitude with respect to time of said AC waveform and a predetermined threshold;

capture means for capturing said digital samples of said AC waveform in response to said trigger signal; and wherein said trigger means includes means for generating the trigger signal when said value representing a change in magnitude with respect to time of said AC waveform is greater than or equal to the predetermined threshold.

11. An apparatus for monitoring an electric power system including an alternating current (AC) waveform having a plurality of AC cycles, said apparatus, comprising:

sensing means for sensing said AC waveform;

sampling means for sampling said AC waveform sensed by said sensing means;

means cooperating with said sampling means for providing a plurality of digital samples of said AC waveform for each of some of the AC cycles of said AC waveform;

means for generating a value representing a change in magnitude with respect to time of said AC waveform from a pair of the digital samples of one of the AC cycles, trigger means for generating at least one trigger signal, with said trigger signal being a function of said value representing a change in magnitude with respect to time of said AC waveform and a predetermined threshold;

capture means for capturing said digital samples of said AC waveform in response to said trigger signal; and wherein the digital samples of said means cooperating with said sampling means includes a plurality of the digital samples before said trigger signal and a plurality of the digital samples after said trigger signal.

12. The apparatus of claim 11 wherein said means cooperating with said sampling means includes means for saving the digital samples before said trigger signal at a first rate and means for saving the digital samples after said trigger signal at a second rate which is faster than the first rate.

13. An apparatus for monitoring an electric power system including a waveform, said apparatus, comprising:

sensing means for sensing said waveform;

sampling means for sampling said waveform sensed by said sensing means;

means cooperating with said sampling means for providing a plurality of digital samples of said waveform;

means for generating a value representing a change in magnitude with respect to time of said waveform from an adjacent pair of the digital samples;

trigger means for generating at least one trigger signal, with said trigger signal being a function of said value representing a change in magnitude with respect to time of said waveform and a predetermined threshold;

capture means for capturing said digital samples of said waveform in response to said trigger signal; and wherein said waveform is an alternating current (AC) waveform having a plurality of AC cycles; wherein said means cooperating with said sampling means includes means for providing said digital samples with a periodic time interval between the adjacent pair of said digital samples; and wherein said means for generating a value includes means for comparing the adjacent pair of said digital samples to determine said value representing a change in magnitude with respect to time within one of the AC cycles of said AC waveform.

* * * * *